(12) United States Patent
Kim et al.

(10) Patent No.: US 10,090,369 B2
(45) Date of Patent: Oct. 2, 2018

(54) ORGANIC LIGHT EMITTING DIODE DISPLAY

(71) Applicant: SAMSUNG DISPLAY CO., LTD., Yongin-si, Gyeonggi-Do (KR)

(72) Inventors: Hwa-Jeong Kim, Cheonan-si (KR); Chi Wook An, Hwaseong-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 34 days.

(21) Appl. No.: 14/944,287

(22) Filed: Nov. 18, 2015

(65) Prior Publication Data

US 2016/0155791 A1 Jun. 2, 2016

(30) Foreign Application Priority Data

Nov. 27, 2014 (KR) ........................ 10-2014-0167393

(51) Int. Cl.
| | | |
|---|---|---|
| *H01L 29/18* | (2006.01) | |
| *H01L 33/00* | (2010.01) | |
| *H01L 29/08* | (2006.01) | |
| *H01L 29/04* | (2006.01) | |
| *H01L 29/10* | (2006.01) | |
| *H01L 29/15* | (2006.01) | |
| *H01L 27/14* | (2006.01) | |
| *H01L 21/00* | (2006.01) | |
| *H01L 27/32* | (2006.01) | |

(52) U.S. Cl.
CPC ...... *H01L 27/3276* (2013.01); *H01L 27/3223* (2013.01); *H01L 2251/568* (2013.01)

(58) Field of Classification Search
CPC ........... H01L 2251/568; H01L 27/3276; H01L 27/3223; G02F 1/136259; G02F 1/136263; G02F 1/136268; G09G 2330/08; G09G 2330/0413
USPC ....... 438/4, 34; 257/59, 72, 40, 88, E51.018
See application file for complete search history.

(56) References Cited

U.S. PATENT DOCUMENTS

| | | | | |
|---|---|---|---|---|
| 2010/0309401 | A1* | 12/2010 | Morita .............. | G02F 1/136259 349/54 |
| 2013/0235279 | A1* | 9/2013 | Sugisaka ............... | G02F 1/1345 348/739 |
| 2014/0292827 | A1* | 10/2014 | Kang ...................... | G09G 3/20 345/690 |
| 2015/0227011 | A1* | 8/2015 | Zhang ............... | G02F 1/136259 257/72 |
| 2015/0241718 | A1* | 8/2015 | Jeong .................... | G02F 1/1309 349/143 |
| 2016/0233286 | A1* | 8/2016 | Kim .................... | H01L 27/3276 |

FOREIGN PATENT DOCUMENTS

| | | |
|---|---|---|
| KR | 10-0765926 B1 | 10/2007 |
| KR | 10-0986845 B1 | 10/2010 |

* cited by examiner

*Primary Examiner* — Fernando L Toledo
*Assistant Examiner* — Aaron Gray
(74) *Attorney, Agent, or Firm* — Lee & Morse, P.C.

(57) ABSTRACT

An organic light emitting diode display including a first connection line connected to an organic light emitting diode; a repair line intersecting the first connection line, the repair line being insulated from the first connection line; and a first welding part that is integrally formed with the first connection line or the repair line, the first welding part being aligned with an intersecting portion of the repair line and the first connecting line, and having a closed loop shape in plan view.

14 Claims, 8 Drawing Sheets

ORGANIC LIGHT EMITTING DIODE DISPLAY

CROSS-REFERENCE TO RELATED APPLICATION

Korean Patent Application No. 10-2014-0167393, filed on Nov. 27, 2014, in the Korean Intellectual Property Office, and entitled: "Organic Light Emitting Diode Display," is incorporated by reference herein in its entirety.

BACKGROUND

1. Field

Embodiments relate to an organic light emitting diode display.

2. Description of the Related Art

A flat panel display may include an organic light emitting diode display, a liquid crystal display, and a plasma display panel, and the like.

The above information disclosed in this Background section is only for enhancement of understanding of the background and therefore it may contain information that does not form the prior art that is already known in this country to a person of ordinary skill in the art.

SUMMARY

Embodiments are directed to an organic light emitting diode display.

The embodiments may be realized an organic light emitting diode display including a first connection line connected to an organic light emitting diode; a repair line intersecting the first connection line, the repair line being insulated from the first connection line; and a first welding part that is integrally formed with the first connection line or the repair line, the first welding part being aligned with an intersecting portion of the repair line and the first connecting line, and having a closed loop shape in plan view.

An interior of the first welding part may be provided with an opening.

One of the first connection line or the repair line may be positioned at a lower portion of the organic light emitting diode display, and another of the first connection line or the repair line is positioned at an upper portion of the organic light emitting diode display, and the first welding part may be integrally formed with the one of the first connection line or the repair line that is positioned at the lower portion of the organic light emitting diode display.

The first welding part may directly connect between the first connection line and the repair line in response to laser welding of the first welding part.

The organic light emitting diode display may further include a plurality of emission pixels that include the organic light emitting diode, the first connection line, and a first pixel circuit connected to the organic light emitting diode; and at least one dummy pixel spaced apart from the emission pixel and including a second pixel circuit, wherein the organic light emitting diode of any one of the plurality of emission pixels is connected to the second pixel circuit of the dummy pixel when the repair line is connected to the first connection line.

The organic light emitting diode that is connected to the second pixel circuit may be disconnected from the first pixel circuit.

The organic light emitting diode may be disconnectable from the first pixel circuit in response to selective irradiation by a laser beam.

The first connection line is connectable to the repair line in response to laser welding of the first welding part.

The organic light emitting diode display may further include a second welding part, wherein the dummy pixel further includes a second connection line that is connected to the second pixel circuit, that intersects the repair line, being and that is insulated from the repair line, the second welding part is integrally formed with the second connection line or the repair line at an intersecting portion of the second connection line and the repair line, and the second welding part has a closed loop shape in plan view.

The second connection line and the repair line may be connectable in response to laser welding of the second welding part.

The repair line may be positioned on a same layer as a gate electrode of a thin film transistor of the first pixel circuit and the second pixel circuit, respectively, the first connection line may be positioned on a same layer as source and data electrodes of the thin film transistor, and the first welding part may be integrally formed with the repair line.

The repair line may be positioned on a same layer as source and data electrodes of a thin film transistor of the first pixel circuit and the second pixel circuit, respectively, the first connection line may be positioned on a same layer as a gate electrode of the thin film transistor, and the first welding part may be integrally formed with the first connection line.

The emission pixel may be in a display area that displays an image, and the dummy pixel may be in a non-display area adjacent to the display area.

BRIEF DESCRIPTION OF THE DRAWINGS

Features will be apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when an element such as a layer, a film, a region, or a plate is referred to as being "on" another element, it may be directly on another element or may have an intervening element present therebetween.

In addition, throughout the specification, unless explicitly described to the contrary, the word "comprise" and variations such as "include," "comprises," or "comprising", will be understood to imply the inclusion of stated elements but not the exclusion of any other elements. In addition, throughout the specification, the word "on" does not necessarily mean that any element is positioned at an upper side based on a gravity direction, but means that any element is positioned above or below a target portion.

Hereinafter, an organic light emitting diode display according to an exemplary embodiment will be described with reference to FIGS. 1 to 6.

Figure 1:
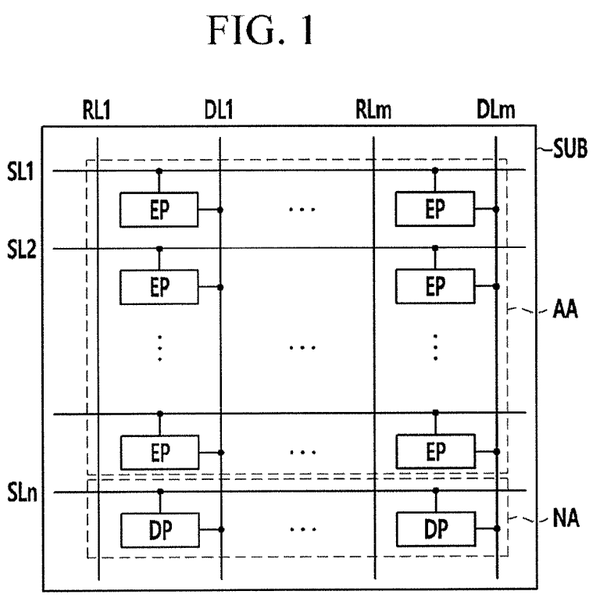
FIG. 1 illustrates a diagram of an organic light emitting diode display according to an exemplary embodiment.

FIG. 1 illustrates a diagram of an organic light emitting diode display according to an exemplary embodiment.

As illustrated in FIG. 1, an organic light emitting diode display according to an exemplary embodiment may include a plurality of scan lines SL1 to SLn, a plurality of data lines DL1 to DLm, a plurality of repair lines RL1 to RLm, a plurality of emission pixels EP, and a plurality of dummy pixels DP. Here, the pixel, e.g., the emission pixel EP, may refer to a minimum unit displaying an image.

In an implementation, in FIG. 1, the organic light emitting diode display according to the exemplary embodiment may include, e.g., a substrate SUB, a scan line SLn, a data line DLm, a repair line RLm, an emission pixel EP, and a dummy pixel DP. For example, the organic light emitting diode display according to the exemplary embodiment may further include signal lines such as a driving power line and an initialization power line.

The substrate SUB may be an insulating substrate including glass, polymer, stainless steel, or the like. The substrate SUB may be flexible, stretchable, foldable, bendable, or rollable. The substrate SUB may be flexible, stretchable, foldable, bendable, or rollable, such that an entire organic light emitting diode display may be flexible, stretchable, foldable, bendable, or rollable. The substrate SUB may include a display area AA displaying an image and a non-display area NA adjacent to the display area AA. The display area AA of the substrate SUB may be provided with the plurality of emission pixels EPs and the non-display area NA of the substrate SUB may be provided with the plurality of dummy pixels DP.

In FIG. 1, the plurality of scan lines SLn may each extend in one direction, e.g., a first or horizontal direction, and thus may be disposed or arranged along another direction that is orthogonal to the one direction, e.g., in a second or vertical direction. The plurality of scan lines SLn may be connected to thin film transistors of the emission pixel EP and the dummy pixel DP and the organic light emitting diode of the emission pixel EP may emit light depending on a signal of the scan line SLn.

In an implementation, one emission pixel EP and one dummy pixel DP may each be connected to one scan line SLn. In an implementation, the plurality of scan lines SLn may be connected to one emission pixel EP and one dummy pixel DP, respectively.

In FIG. 1, the plurality of data lines DLm may each extend in the second direction, e.g., a vertical direction, and thus may be disposed in or arranged along the first direction, e.g., a horizontal direction. The plurality of data lines DLm may intersect the plurality of scan lines SLn, and may be insulated therefrom. The plurality of data lines DLm may be connected to thin film transistors of the emission pixel EP and the dummy pixel DP, respectively, and the organic light emitting diode of the emission pixel EP may emit light depending on a signal of the data line DLm.

In an implementation, one emission pixel EP and one dummy pixel DP may each be connected to one data line DLm. In an implementation, the plurality of data lines DLm may be connected to one emission pixel EP and one dummy pixel DP, respectively. In this case, the plurality of data lines DLm may include the data line, the driving power line, and the like.

In FIG. 1, the plurality of repair lines RLm may each extend in the second direction, e.g., a vertical direction, and may be disposed in or arranged along the first direction, e.g., a horizontal direction. The plurality of repair lines RLm may each intersect the plurality of scan lines SLn, and may be insulated therefrom. The plurality of repair lines RLm may be adjacent to the emission pixel EP and the dummy pixel DP, respectively. When a specific emission pixel EP among the plurality of emission pixels EP (which are adjacent to one repair line RLm) has a defect, e.g., if a pixel circuit is defective, the defective specific emission pixel EP may be connected to the repair line RLm. The repair line RLm that is connected to the specific emission pixel EP may be connected to the dummy pixel DP, e.g., to a pixel circuit of the dummy pixel DP. A connection between the defective specific emission pixel EP and the repair line RLm and a connection between the repair line RLm and the dummy pixel DP will be described below.

The plurality of repair lines RLm may be, e.g., positioned on a same layer as the scan line SLn, positioned on a same layer as the data line DLm, or positioned on a different layer from the scan line SLn and the data line DLm, respectively.

The plurality of emission pixels EP may be positioned in the display area AA of the substrate SUB and may display the image. The emission pixel EP may include a first pixel circuit (which includes a plurality of thin film transistors and at least one capacitor) and an organic light emitting diode (which is connected to the first pixel circuit). The plurality of emission pixels EP may be connected to the scan line SLn and the data line DLm and may emit light by a signal through the scan line SLn and the data line DLm, respectively.

The plurality of dummy pixels DP may be spaced apart from the plurality of emission pixels EP and may be positioned in the non-display area NA of the substrate SUB. The dummy pixel DP may include a second pixel circuit (which includes a plurality of thin film transistors and at least one capacitor). The plurality of dummy pixels DP may be connected to the scan line SLn and the data line DLm and may transfer a same signal as the emission pixel EP through the scan line SLn and the data line DLm, respectively.

Hereinafter, the repair using the repair line will be described with reference to FIGS. 2 to 4.

Figure 2A:
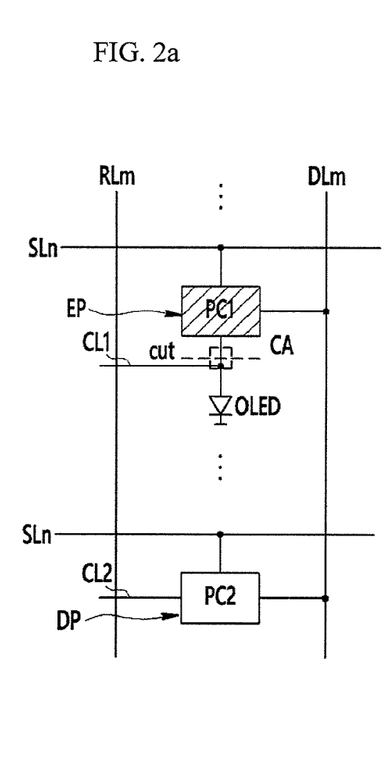
FIGS. 2(a) and 2(b) illustrate a diagram of a method for repairing an organic light emitting diode display according to an exemplary embodiment.
Figure 2B:
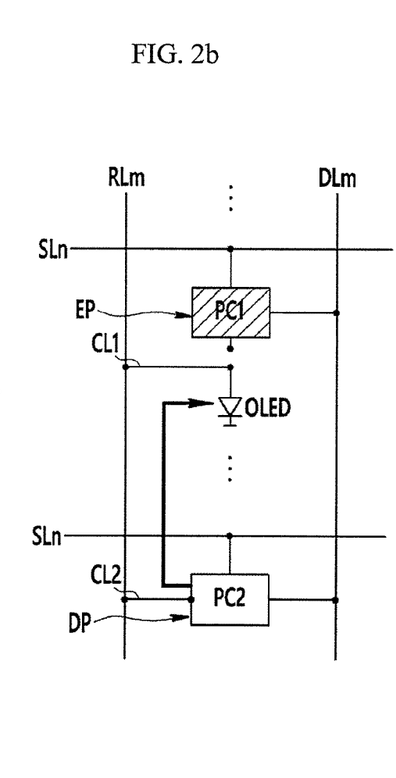

FIGS. 2(a) and 2(b) illustrate a diagram of a method for repairing an organic light emitting diode display according to an exemplary embodiment. FIG. 2(a) illustrates the emission pixel and the dummy pixel which are not repaired and FIG. 2(b) illustrates the emission pixel and the dummy pixel which are repaired. FIG. 3 illustrates a cross-sectional view of a portion of the unrepaired organic light emitting diode display, according to the exemplary embodiment.

Figure 3:
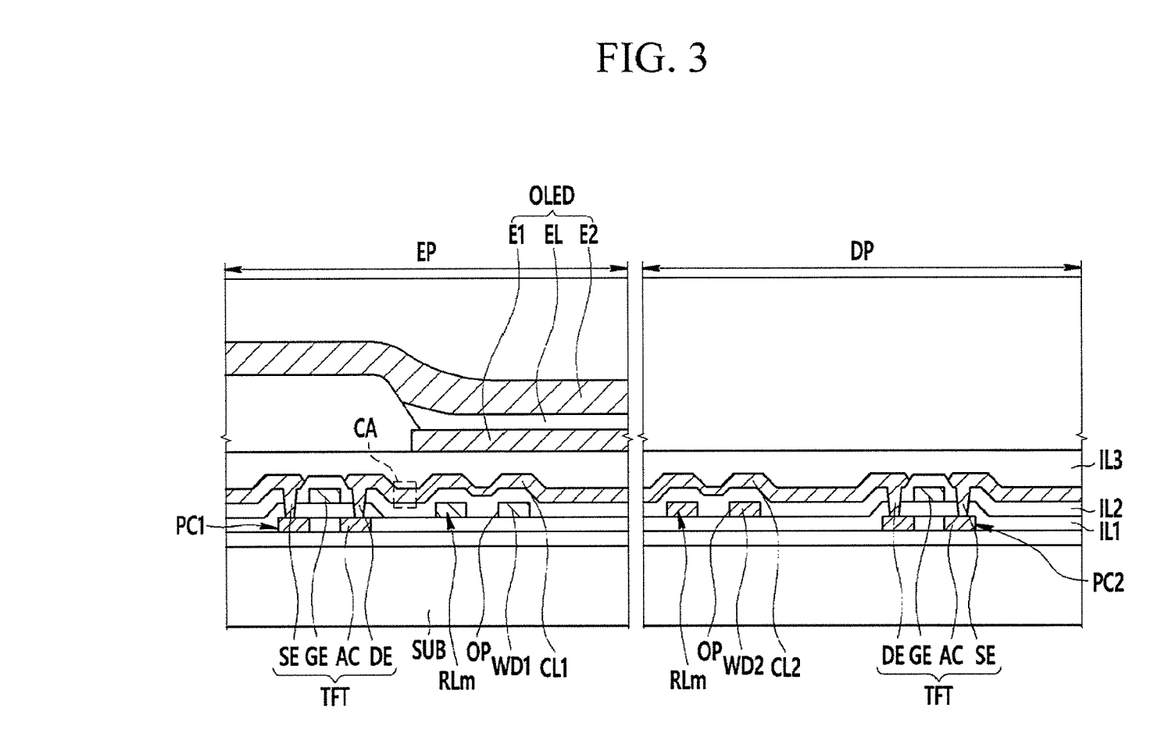
FIG. 3 illustrates a cross-sectional view of an unrepaired portion of the organic light emitting diode display according to the exemplary embodiment.

As illustrated in FIGS. 2(a) and 3, the emission pixel EP may include a first pixel circuit PC1, an organic light emitting diode OLED (connected to the first pixel circuit PC1), and a first connection line CL1 (connected to the organic light emitting diode OLED, intersecting the repair line RLm, and being insulated from the repair line RLm). In an implementation, the first connection line CL1 may be integrally formed with a source electrode SE and/or a drain electrode DE of a thin film transistor TFT. In an implementation, the first connection line CL1 may be formed on a different layer from the source electrode SE and the drain electrode DE. The repair line RLm may be positioned under the first connection line CL1, e.g., the repair line RLm may be between the first connection line CL1 and the substrate. One portion of the repair line RLm may be positioned under the first connection line CL1 to intersect or underlie the first connection line CL1, may be insulated from the first connection line CL1, may be integrally formed with, e.g., other portions of the repair line RLm, and may be provided with a first welding part WD1 having a closed loop shape in two dimensions, e.g., in plan view. A central interior of the first welding part WD1 may be provided with an opening OP.

In an implementation, the repair line RLm may be positioned on a same layer as a gate electrode GE of the thin film transistor TFT, which configures the first pixel circuit PC1 and the second pixel circuit PC2, respectively. In an implementation, the repair line RLm may be positioned on a different layer from the gate electrode GE.

The dummy pixel DP may include the second pixel circuit PC2 and a second connection line CL2. The second connection line CL2 may be connected to the second pixel circuit PC2, may intersect the repair line RLm, and may be insulated from the repair line RLm. In an implementation, the second connection line CL2 may be integrally formed with the source electrode SE and/or the drain electrode DE of the thin film transistor (TFT). In an implementation, the second connection line CL2 may be formed on a different layer from the source electrode SE and the drain electrode DE. The repair line RLm may be positioned under the second connection line CL2, e.g., the repair line RLm may be between the second connection line CL2 and the substrate. Another portion of the repair line RLm, which is positioned under the second connection line CL2 to intersect the second connection line CL2, and being insulated therefrom, may be integrally formed with the repair line RLm. The repair line RLm may be provided with a second welding part WD2 that has a closed loop shape in two dimensions. A central interior of the second welding part WD2 may be provided with the opening OP.

The first pixel circuit PC1 of the emission pixel EP and the second pixel circuit PC2 of the dummy pixel DP may each include the plurality of thin film transistor TFT which include an active layer AC, a gate electrode GE, a source electrode SE, a drain electrode DE and at least one capacitor. A first insulating layer IL1 may be positioned between the gate electrode GE and the active layer AC, a second insulating layer IL2 may be positioned between the gate electrode GE and the source electrode SE, and the source electrode SE and the drain electrode DE may be covered with a third insulating layer IL3. The first insulating layer IL1, the second insulating layer IL2, and the third insulating layer IL3 may each be formed in a single layer or a multilayer that includes an organic material or an inorganic material. The organic light emitting diode OLED may include a first electrode E1 connected to the thin film transistor TFT, an organic emission layer EL on the first electrode E1, and a second electrode E2 on the first electrode E1, e.g., having the organic emission layer EL therebetween. At least one of the first electrode E1 and the second electrode E2 may be formed of or as a light transmitting electrode, and light emitted from the organic emission layer EL may be emitted in at least one electrode direction of the first electrode E1 and the second electrode E2. For example, the organic light emitting diode display may be formed in a top emission type and/or a bottom emission type.

In an implementation, when the first pixel circuit PC1 of one of the plurality of emission pixels EPs has a defect, a cutting area CA between the first pixel circuit PC1 and the organic light emitting diode OLED may be cut. The cutting may be performed using a laser beam. For example, a conductive pattern between the drain electrode DE of the thin film transistor TFT and the first electrode E1 of the organic light emitting diode OLED may be cut by using the laser beam. Thus, the first pixel circuit PC1 may be separated or disconnected from the organic light emitting diode OLED.

For example, the organic light emitting diode OLED may be disconnected from the first pixel circuit PC1, and the disconnection may be performed by or using the laser beam.

Figure 4:
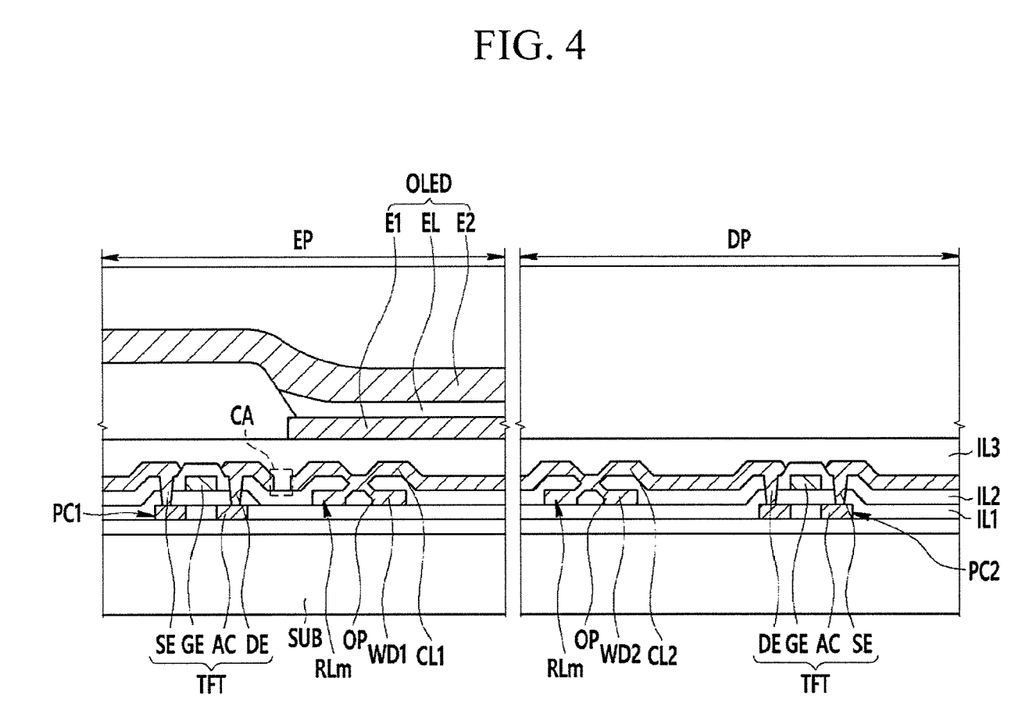
FIG. 4 illustrates a cross-sectional view of a repaired portion of the organic light emitting diode display according to the exemplary embodiment.

FIG. 4 illustrates a cross-sectional view of a repaired portion of the organic light emitting diode display, according to the exemplary embodiment.

As illustrated in FIGS. 2(b) and 4, the first connection line CL1 may be directly connected to the repair line RLm by, e.g., in response to, laser welding of the first welding part WD1 to thereby connect the repair line RLm to the organic light emitting diode OLED of the emission pixel EP. The second connection line CL2 may be directly connected to the repair line RLm by laser welding of the second welding part WD2 to connect the second pixel circuit PC2 of the dummy pixel DP to the repair line RLm to which the organic light emitting diode OLED is connected. For example, in response to cutting the connection between the first pixel circuit and the OLED and to laser welding or melting of the first and second welding parts, the OLED of the emission pixel EP may bypass the defective first pixel circuit PC1 associated therewith and effect a connection with the functioning second pixel circuit PC2 of the dummy (auxiliary) pixel DP.

As a result, the organic light emitting diode OLED of one of the plurality of emission pixels EP may be connected to the second pixel circuit PC2 of the dummy pixel DP through the repair line RLm that is connected to the first connection line CL1. Further, the organic light emitting diode OLED connected to the second pixel circuit PC2 of the dummy pixel DP may be disconnected from the (defective) first pixel circuit PC1 of the emission pixel EP.

As described above, the first pixel circuit PC1 of the defective emission pixel EP may be disconnected from the organic light emitting diode OLED, and the organic light emitting diode OLED of the emission pixel EP may be connected to the second pixel circuit PC2 of the dummy pixel DP by using the repair line RLm to perform the repair. Accordingly, the organic light emitting diode OLED of the affected emission pixel EP may emit light by using the second pixel circuit PC2 of the dummy pixel DP (e.g., bypassing the defective first pixel circuit PC1).

In an implementation, the repair may be performed prior to forming the organic emission layer EL or may be performed after forming the organic emission layer EL.

The repair may be easily performed by using the foregoing first welding part WD1 and second welding part WD2, which will be described below.

Hereinafter, a portion where the laser welding is performed at the time of repairing the organic light emitting diode display according to the exemplary embodiment will be described in more detail with reference to FIGS. 5 and 6.

Figure 5:
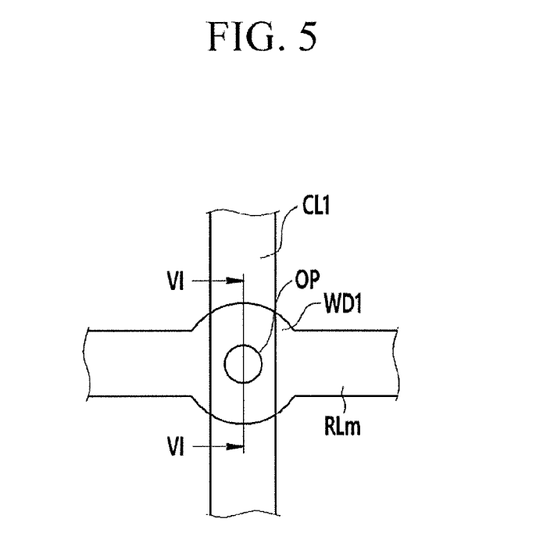
FIG. 5 illustrates a plan view of a repair line and a first connection line of the organic light emitting diode display according to the exemplary embodiment.

FIG. 5 illustrates a plan view of the repair line and the first connection line of the organic light emitting diode display according to the exemplary embodiment. FIGS. 6(*a*) and 6(*b*) illustrate cross-sectional views taken along the line VI-VI of FIG. 5.

Figure 6A:
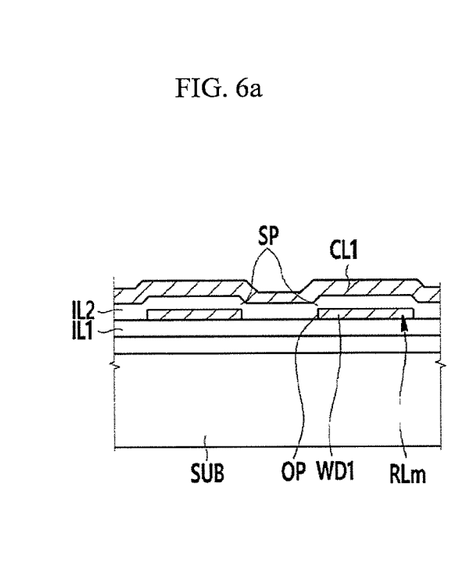
FIGS. 6(a) and 6(b) illustrate cross-sectional views taken along the line VI-VI of FIG. 5.

As illustrated in FIG. 5 and FIG. 6(*a*), the repair line RLm may intersect the first connection line CL1 and may be insulated from the first connection line CL1 (e.g., in a normal operating state of the display). The repair line RLm may be positioned under the first connection line CL1, e.g., may be between the first connection line CL1 and the substrate SUB.

In an implementation, the first connection line CL1 may be integrally formed with the source electrode SE and/or the drain electrode DE of the thin film transistor TFT. In an implementation, the first connection line CL1 may be formed on a different layer from the source electrode SE and the drain electrode DE.

One portion of the repair line RLm (under the first connection line CL1, intersecting the first connection line CL1, and insulated from the first connection line CL1) may be integrally formed with other portions of the repair line RLm and may thus be provided with the first welding part WD1 (having the closed loop shape in two dimensions). The central interior of the first welding part WD1 may be provided with the opening OP.

In an implementation, the repair line RLm may be positioned on a same layer as the gate electrode GE of the thin film transistor TFT of the first pixel circuit PC 1 and the second pixel circuit PC2, respectively. In an implementation, the repair line RLm may be positioned on a different layer from the gate electrode GE.

Figure 6B:
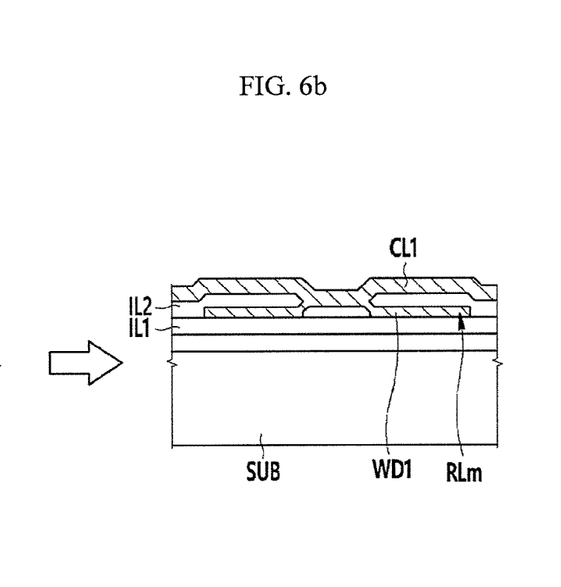

As illustrated in FIG. 5 and FIG. 6(*b*), when the laser beam is irradiated to the opening OP (in the central interior of the first welding part WD1), one portion SP of the second insulating layer IL2 that contacts or overlies the opening OP (and on which a stress is more highly concentrated than other portions) may be destroyed or decomposed by the laser beam. At the same time, the first welding part WD1 may be melted. As a result, the first welding part WD1 of the repair line RLm may be easily welded to the first connection line CL1 (e.g., in order to disconnect the OLED from a defective pixel circuit and connect the OLED to a functioning pixel circuit of a dummy pixel DP).

For example, the first welding part WD1 may have the opening OP therein and may have the closed loop shape in two dimensions and thus contacts or surrounds the opening OP. As a result, one portion SP of the second insulating layer IL2 (on or at which stress is concentrated) may be easily destroyed or decomposed. Thus, the welding between the first welding part WD1 (of the repair line RLm) and the first connection line CL1 may be easily performed, such that the laser welding between the first connection line CL1 and the repair line RLm may be easily performed. Such a configuration facilitates the overall repair. Thus, the organic light emitting diode display in which a defective specific pixel is easily repaired may be provided.

In an implementation, the organic light emitting diode display according to the exemplary embodiment may perform the repair of the emission pixel EP using the dummy pixel DP. In an implementation, an organic light emitting diode display according to another exemplary embodiment may include the repair line RLm, the first connection line CL1, and the first welding part WD1, and the repair may be easily performed even in any structure.

In an implementation, the first welding part WD1 of the organic light emitting diode display according to the exemplary embodiment may have a closed loop shape in two dimensions. In an implementation, if the first welding part WD1 according to another exemplary embodiment has a central interior provided with the opening OP, the first welding part WD1 may have a ring shape, e.g., a circle, an oval, a triangle, a quadrangle, a pentagon, a hexagon, a heptagon, an octagon, a nonagon, and a decagon and the like, in two dimensions.

Hereinafter, the laser welding being performed at the time of repairing the organic light emitting diode display according to another exemplary embodiment will be described in more detail with reference to FIGS. 7, 8(*a*), and 8(*b*).

Figure 7:
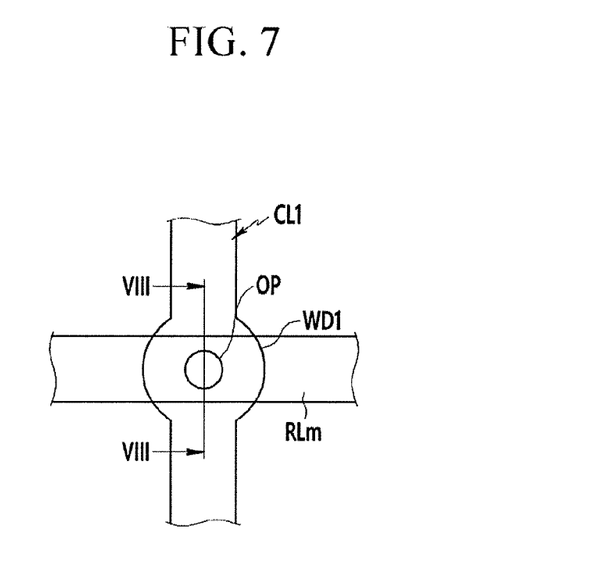
FIG. 7 illustrates a plan view of a repair line and a first connection line of an organic light emitting diode display according to another exemplary embodiment.

FIG. 7 illustrates a plan view of a repair line and a first connection line of an organic light emitting diode display according to another exemplary embodiment. FIGS. 8(*a*) and 8(*b*) illustrate cross-sectional views taken along line VIII-VIII of FIG. 7.

Figure 8A:
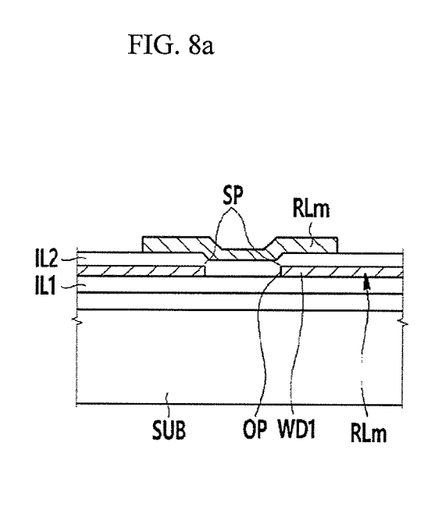
FIGS. 8(a) and 8(b) illustrate cross-sectional views taken along line VIII-VIII of FIG. 7.

As illustrated in FIG. 7 and FIG. 8(*a*), the repair line RLm may intersect the first connection line CL1 and may be insulated from the first connection line CL1. The first connection line CL1 may be positioned under the repair line RLm, e.g., the first connection line CL1 may be between the repair line RLm and the substrate SUB.

The first connection line CL1 may be positioned on the same layer as the gate electrode GE of the thin film transistor TFT.

The repair line RLm may be positioned on the same layer as the source electrode SE and the drain electrode DE of the thin film transistor TFT.

One portion of the first connection line CL1 (under the repair line RLm, intersecting the first repair line RLm, and insulated from the first repair line RLm) may be integrally formed with the other, remaining portions of the first connection line CL1. Thus, the one portion of the first connection line CL1 may be provided with the first welding part WD1 having the closed loop shape in two dimensions. The central interior of the first welding part WD1 may be provided with the opening OP.

Figure 8B:
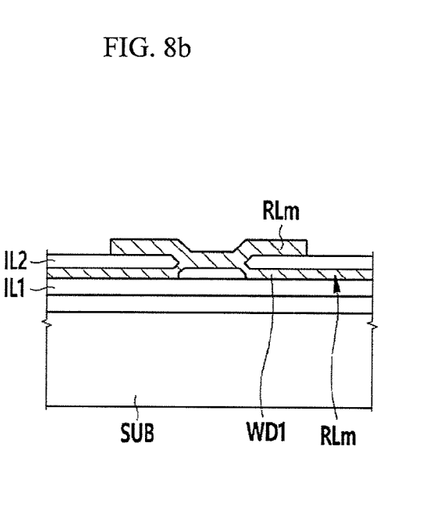

As illustrated in FIG. 7 and FIG. 8(*b*), when the laser beam is irradiated to the opening OP in the central interior of the first welding part WD1, one portion SP of the second insulating layer IL2 (contacting the opening OP and on which a stress is more heavily concentrated than other portions) may be destroyed or decomposed by the laser beam. At the same time, the first welding part WD1 may be melted. As a result, the first welding part WD1 of the first connection line CL 1 may be easily welded to the repair line RLm.

For example, the first welding part WD1 may include the opening OP therein and may have the closed loop shape in two dimensions and thus may contact the opening OP. As a result, one portion SP of the second insulating layer IL2 (on which stress is concentrated) may be easily destroyed and thus the welding between the first welding part WD1 and the first connection line CL1 may be easily performed. Thus, the laser welding between the first connection line CL1 and the repair line RLm may be easily performed. Therefore, the overall repair may be facilitated, and thus the organic light emitting diode display in which the defective specific pixel is easily repaired may be provided.

By way of summation and review, in an organic light emitting diode display, which is a display having a plurality of self-emission pixels, when a specific pixel has a defect, the defective specific pixel may be recognized as a bright spot.

The embodiments may provide an organic light emitting diode display having advantages of easily repairing a defective specific pixel.

According to an exemplary embodiment, it is possible to provide the organic light emitting diode display in which the defective specific pixel may be easily repaired.

The embodiments may provide an organic light emitting diode display that may be repaired.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode display, comprising:
   a first connection line connected to an organic light emitting diode;
   a repair line intersecting the first connection line, the repair line being insulated from the first connection line; and
   a first welding part that is integrally formed with the first connection line or the repair line, the first welding part:
   being aligned with an intersecting portion of the repair line and the first connecting line, and
   having a closed loop shape in plan view, the closed loop shape of the first welding part having a width greater than that of the first connection line and the repair line, wherein:
   one portion of the closed loop shape overlaps one of the first connection line or the repair line, and
   another portion of the closed loop shape non-overlaps the one of the first connection line or the repair line.

2. The organic light emitting diode display as claimed in claim 1, wherein an interior of the first welding part is provided with an opening.

3. The organic light emitting diode display as claimed in claim 2, wherein:
   one of the first connection line or the repair line is positioned at a lower portion of the organic light emitting diode display, and another of the first connection line or the repair line is positioned at an upper portion of the organic light emitting diode display, and
   the first welding part is integrally formed with the one of the first connection line or the repair line that is positioned at the lower portion of the organic light emitting diode display.

4. The organic light emitting diode display as claimed in claim 1, wherein the first welding part is configured to directly connect between the first connection line and the repair line in response to laser welding of the first welding part.

5. The organic light emitting diode display as claimed in claim 1, further comprising:
   a plurality of emission pixels that include the organic light emitting diode, the first connection line, and a first pixel circuit connected to the organic light emitting diode; and
   at least one dummy pixel spaced apart from the emission pixel and including a second pixel circuit,
   wherein the organic light emitting diode of any one of the plurality of emission pixels is connectable to the second pixel circuit of the dummy pixel when the repair line is connected to the first connection line.

6. The organic light emitting diode display as claimed in claim 5, wherein the organic light emitting diode that is connectable to the second pixel circuit is disconnectable from the first pixel circuit.

7. The organic light emitting diode display as claimed in claim 6, wherein the organic light emitting diode is disconnectable from the first pixel circuit in response to selective irradiation by a laser beam.

8. The organic light emitting diode display as claimed in claim 5, wherein the first connection line is connectable to the repair line in response to laser welding of the first welding part.

9. The organic light emitting diode display as claimed in claim 5, further comprising a second welding part, wherein:
   the dummy pixel further includes a second connection line that is connected to the second pixel circuit, that intersects the repair line, being and that is insulated from the repair line,
   the second welding part is integrally formed with the second connection line or the repair line at an intersecting portion of the second connection line and the repair line, and
   the second welding part has a closed loop shape in plan view.

10. The organic light emitting diode display as claimed in claim 9, wherein the second connection line and the repair line are connectable in response to laser welding of the second welding part.

11. The organic light emitting diode display as claimed in claim 5, wherein:
    the repair line is positioned on a same layer as a gate electrode of a thin film transistor of the first pixel circuit and the second pixel circuit, respectively,
    the first connection line is positioned on a same layer as source and data electrodes of the thin film transistor, and
    the first welding part is integrally formed with the repair line.

12. The organic light emitting diode display as claimed in claim 5, wherein:
    the repair line is positioned on a same layer as source and data electrodes of a thin film transistor of the first pixel circuit and the second pixel circuit, respectively,
    the first connection line is positioned on a same layer as a gate electrode of the thin film transistor, and
    the first welding part is integrally formed with the first connection line.

13. The organic light emitting diode display as claimed in claim 5, wherein:
    the emission pixel is in a display area that displays an image, and
    the dummy pixel is in a non-display area adjacent to the display area.

14. The organic light emitting diode display as claimed in claim 2, wherein the first connection line or the repair line protrudes toward the opening of the first welding part in a vertical direction.

* * * * *